United States Patent [19]

Aiken et al.

[11] 4,137,109

[45] Jan. 30, 1979

[54] SELECTIVE DIFFUSION AND ETCHING METHOD FOR ISOLATION OF INTEGRATED LOGIC CIRCUIT

[75] Inventors: James G. Aiken; Benjamin J. Sloan, Jr., both of Richardson, Tex.

[73] Assignee: Texas Instruments Incorporated, Dallas, Tex.

[21] Appl. No.: 765,325

[22] Filed: Feb. 3, 1977

Related U.S. Application Data

[62] Division of Ser. No. 676,023, Apr. 12, 1976, abandoned.

[51] Int. Cl.² .................... H01L 21/302; H01L 21/76
[52] U.S. Cl. ........................... 148/175; 29/576 W;
29/578; 29/580; 148/1.5; 148/187; 156/647;
156/648; 156/649; 156/662; 357/44; 357/46;
357/50; 357/52; 357/55; 357/92
[58] Field of Search ................. 148/175, 187, 1.5;
357/44, 46, 50, 52, 55, 92; 29/576 W, 578, 580;
156/647, 648, 649, 652, 653, 662

[56] References Cited

U.S. PATENT DOCUMENTS

| 3,503,124 | 3/1970 | Wanlass et al. | 29/578 X |
|---|---|---|---|
| 3,550,260 | 12/1970 | Saltich et al. | 357/15 X |
| 3,737,702 | 6/1973 | Kooi et al. | 357/30 X |
| 3,755,001 | 8/1973 | Kooi et al. | 148/187 X |
| 3,823,353 | 7/1974 | Berger et al. | 357/92 X |
| 3,873,383 | 3/1975 | Kooi | 148/187 |
| 3,891,469 | 6/1975 | Moriyama et al. | 148/187 X |
| 3,909,807 | 9/1975 | Fulton | 357/92 X |
| 3,962,717 | 6/1976 | O'Brien | 357/44 |
| 3,982,266 | 9/1976 | Matzen et al. | 357/44 |
| 4,008,107 | 2/1977 | Hayasaka et al. | 148/175 |
| 4,075,039 | 2/1978 | Sloan | 14/1.5 |

OTHER PUBLICATIONS

Berger et al., "Schottky Transistor Logic" ISSCC, 1975 (Feb.) Digest of Tech. Papers-Fam 14.6, pp. 172-173.
Altman, L., Ed. "Injection Logic's Range . . . is widest," Electronics, Jul. 10, 1975, pp. 86-89.
Berger et al., "Bipolar LSI Breakthrough, Part 2: . . . Limits" Electronics, Oct. 2, 1975, pp. 99-103.
Mulder et al., "High-Speed Integrated Injection Logic (I²L)", IEEE J. of Solid-State Circuits, vol. SC-11, No. 3, Jun. 1976, pp. 379-385.

Primary Examiner—L. Dewayne Rutledge
Assistant Examiner—W. G. Saba
Attorney, Agent, or Firm—James T. Comfort; Gary C. Honeycutt

[57] ABSTRACT

An integrated injection logic circuit, wherein the inverted, multi-collector transistor of each cell includes active base regions separated by dielectric isolation, and wherein a heavily-doped channel-stop layer is selectively located along the sidewalls of the isolation, to prevent collector-to-emitter surface inversion leakage. The isolated geometry substantially reduces parasitic capacitance between the substrate and the extrinsic base, thereby increasing the switching speed of the device.

4 Claims, 7 Drawing Figures

SELECTIVE DIFFUSION AND ETCHING METHOD FOR ISOLATION OF INTEGRATED LOGIC CIRCUIT

This is a division, of application Ser. No. 676,023, filed Apr. 12, 1976 now abandoned.

This invention relates to microelectronic semiconductor circuits, and more particularly, to a dielectric isolation technique and structure characterized by the selective location of means to prevent surface inversion along the sidewalls of the isolation regions. For example, an intergrated injection logic circuit is provided with dielectric isolation between active base regions.

Integrated injection logic ($I^2L$) is generally defined as a circuit configuration wherein a lateral PNP transistor is combined with an inverted, multi-collector NPN vertical transistor to achieve high packing density and a very low speed-power product. Until recently, such circuits were not considered attractive for commercial implementation due to their low inverse NPN current gain, low collector-base breakdown voltage, and high collector-base capacitance.

The low inverse gain was due to a very unfavorable collector-to-emitter area ratio, a low emitter efficiency, and a drift field in the base which caused the drift and diffusion components of electron current to go in opposite directions. The high collector-base capacitance and low breakdown voltage were due to the location of the collector in the heavily doped surface portion of a diffused base profile.

Many of these disadvantages were recently overcome by the development of an ion-implanted base region to reverse the direction of the concentration gradient of a diffused base, and by the use of a heavily-doped extrinsic base region to provide ohmic contact to the active base regions, and to limit the area of the active emitter-base regions, thereby increasing the effective or "active" collector-to-emitter area ratio of the device. See for example, U.S. Pat. No. 4,075,039 issued to Benjamin J. Sloan, Jr.

Further increases in the speed of such $I^2L$ circuits can be achieved by reducing the parasitic capacitance between the substrate and the extrinsic base regions. Although oxide isolation has been proposed as a modification of earlier structures, no practical isolation process has been available, particularly in combination with the newer versions of $I^2L$, such as the structure of the referenced Sloan application.

In accordance with one aspect of the present invention, an integrated semiconductor injection logic circuit is provided with a dielectric region extending between and partially isolating two or more collector-base regions from each other, and including means for preventing the formation of an inversion channel along the boundary of the active base regions adjacent the isolation walls.

Another aspect of the invention relates to a process for the fabrication of a channel-stop layer selectively located along the sidewalls of an isolation region, such that the channel-stop layer does not extend beneath the isolation region. The method includes the steps of patterning a suitable mask layer on the semiconductor slice to define and expose an area thereof where the isolation region is to be formed, then selectively diffusing a suitable dopant into the exposed area of the semiconductor surface, and then etching the semiconductor slice through the same mask aperture, whereby the full vertical extent of the diffused region is removed, while leaving at least a portion of the laterally diffused region intact. The etched moat is then selectively oxidized, again using the same mask aperture, thereby completing the fabrication of isolation regions adjacent the retained portions of the laterally diffused area. Thus, when $I^2L$ device regions are completed to include active P-base portions isolated by said oxidized regions, channel inversion is prevented by the laterally doped layer adjacent the isolation sidewalls.

Although the sidewall isolation process, as described, has been developed specifically for the isolation of $I^2L$ base regions, it will be apparent to those skilled in the art that such an isolation technique can be applied to other oxide-isolated integrated circuits wherein sidewall channel-stop regions are desired.

Figure 1:
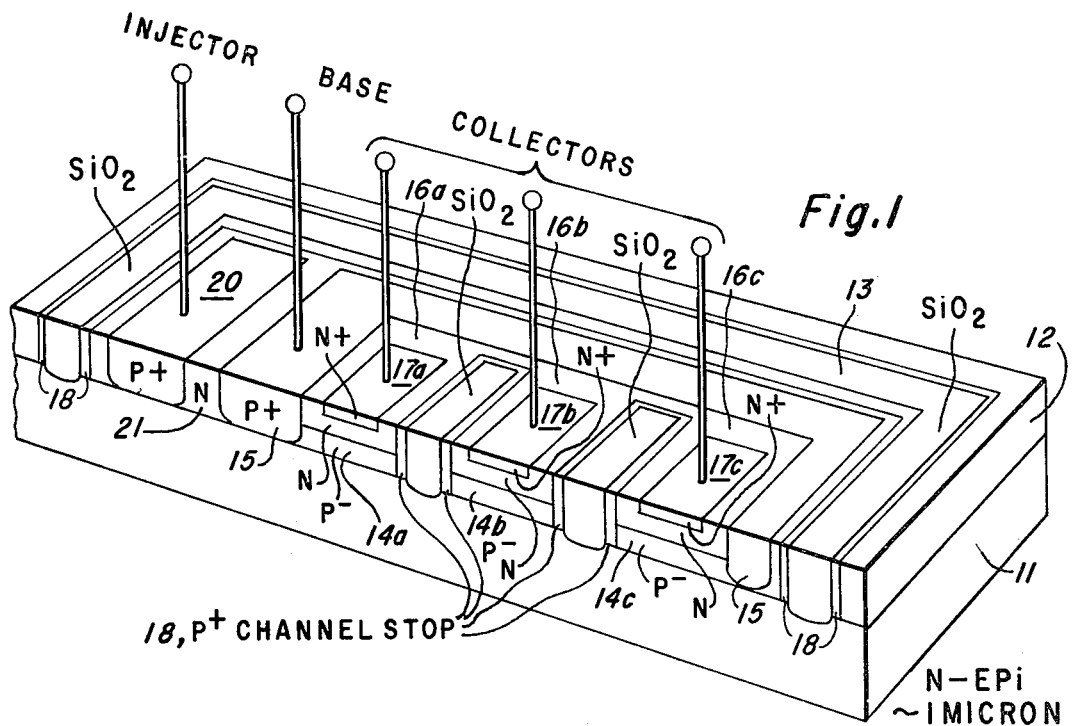
FIG. 1 is an enlarged schematic perspective view, partially in section, of a semiconductor device embodying one aspect of the invention.
Figure 2:
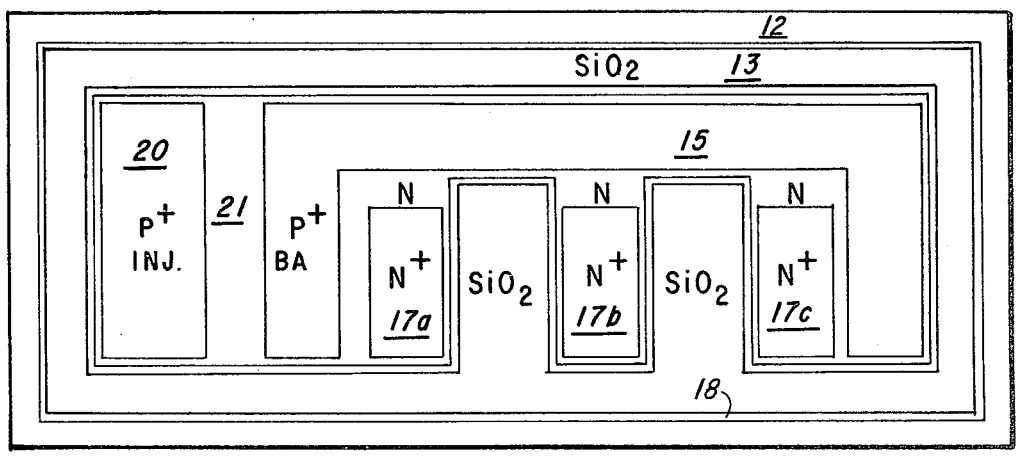
FIG. 2 is an enlarged schematic top view of the unit cell shown in FIG. 1.

In FIGS. 1 and 2, the preferred embodiment is seen to consist of an N+ substrate 11 having a resistivity of 0.005–0.05 ohm-centimeter which functions as the emitter of a vertical, inverted, multi-collector NPN transistor and an N-, one-micron-thick epitaxial layer 12 having a resistivity of 0.3–2.0 ohm-centimeter wherein the remaining active regions are formed, and wherein oxide guard ring 13 is located. The perimeter of active base regions 14 of the inverted NPN transistor are defined in part by P+ region 15 which constitutes the inactive, or extrinsic, portion of the base. This layer has a sheet resistance of 25–30 ohms per square, which significantly reduces series base resistance, and provides heavy doping at the surface for good ohmic contact. The active base regions are formed by a high-energy, low-dose boron implant of about $10^{12}$ ions per cubic centimeter with preferred beam energies in the range of 400–600 kev.

The heavily doped P+ extrinsic base has two important functions: (1) it limits the voltage difference between different parts of the base due to base current, and thus provides more nearly equal forward emitter-base bias voltage throughout a multi-collector implanted gate, and (2) the current density from the emitter into the P+ region is much lower than emiter-into-P— at the same emitter-base voltage. The area of each active emitter-base region is defined in part by P+ region 15 in combination with the oxide guard ring. Thus, the combination limits the region of significant current injection to that region immediately below each collector, and decreases the ratio of effective emitter area to effective collector area by up to fifty times, compared to conventional $I^2L$, because in a practical device design the extrinsic base area may be a much as fifty times larger than the active or intrinsic base area.

The P+ channel stop zones 18 constitute a key feature of the present invention because they prevent NPN collector-to-emitter surface inversion leakage along the sidewalls of the oxide isolation. It will be apparent that the P+ channel stop zones must not extend below the oxide isolation since this would provide a direct current path between regions 15 and 20; and also between adjacent cells.

Collector regions 16 correspond essentially to the orginal epitaxial layer 12. N+ regions 17 are contact enhancement zones, having a sheet resistance of 50-100 ohms per square, for facilitating ohmic contact to the collector regions.

In an alternate embodiment, the active base regions are formed by a low-dose boron implant at energy levels below 400 kev, in which case the base regions may extend to the surface of epi layer 12. Thus, the collector zones would consist essentially of N+ regions 17. Such an embodiment is somewhat less efficient, but is a particularly useful alternative to those workers not having beam energies as great as 400 kev.

Lateral PNP transistor action is provided by injector 20 in combination with P+ region 15 separated by a portion 21 of epitaxial layer 12. Regions 20 and 15 are spaced as closely as possible, i.e., 0.2-0.5 mil.

The peripheral portions of oxide guard ring 13 surround and isolate the complete unit cell from adjacent cells, and preferably extends through the complete thickness of epitaxial layer 12. However, it is not essential for most purposes that the guard ring be as deep as is shown in this embodiment.

Figure 3:
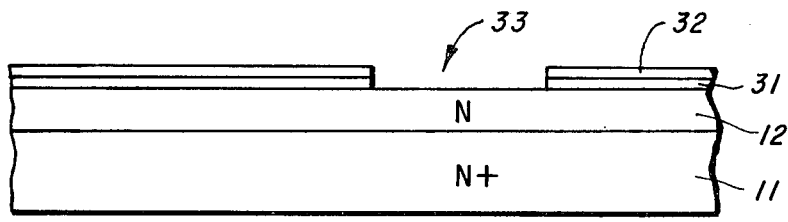
FIGS. 3–7 are enlarged cross-section views of a semiconductor structure illustrating the sequence of process steps used in the fabrication of the sidewall channel-stops of the device of FIGS. 1 and 2.

As shown in FIG. 3, a preferred process embodiment of the invention begins with the epitaxial growth of layer 12, having a resistivity of 0.3-2.0 ohm centimeters and a thickness of approximately 1-2 microns, upon substrate 11 doped to 0.005-0.05 ohm-centimeter, and preferably about 0.01 ohm-centimeter, with antimony or arsenic. A selective masking layer capable of resisting diffusion, etching, and oxidation is then patterned atop layer 12, consisting of silicon oxide layer 31 and silicon nitride layer 32, patterned to provide aperture 33 exposing that portion of layer 12 wherein the oxide isolation zones are desired.

Figure 4:
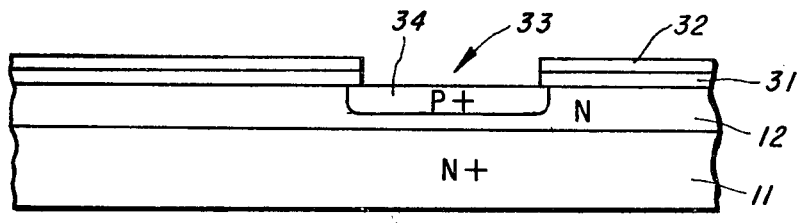

As shown in FIG. 4 the slice is then selectively exposed to boron diffusion to form P+ region 34 having a sheet resistance of about 100 ohms per square. This diffusion is excluded from the surface aperture 33 in the region between the injector 20 and P+ region 15 in order to prevent a PNP collector-emitter short circuit.

Figure 5:
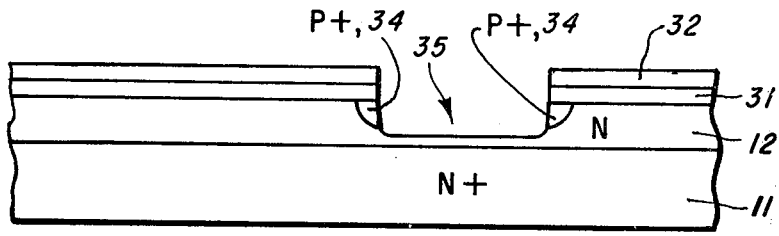

As shown in FIG. 5 the slice is then subjected to a selective etch step which is capable of removing the indicated portion 35 of layer 12 through the same mask aperture as previously formed. A nonundercutting etch is required, such as crystallographic orientation-dependent etching, or plasma etching, in order to obtain an etching depth sufficient to exceed the depth of region 34 without removing the peripheral, laterally-diffused regions 34 as indicated in FIG. 5.

Figure 6:
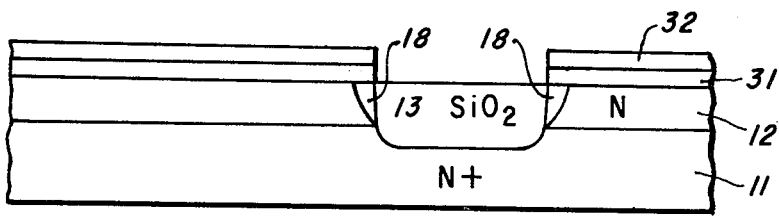

As shown in FIG. 6, the structure of FIG. 5 is then selectively oxidized to complete the formation of oxide isolation zone 13 having channel-stop layers 8 extending along the sidewalls. By coordinating the depth of P+ diffusion 34 and the etching depth of moat 35 the oxidation step is completed when the surface of isolation zone 13 becomes substantially coplanar with the original surface of epitaxial layer 12. For example, a diffusion depth of 0.4 micron and an etch depth of 0.6 micron, followed by oxidation to a depth of 1.1 micron permits coplanarity to be achieved, due to the lower density of the oxide compared with the original silicon.

Figure 7:
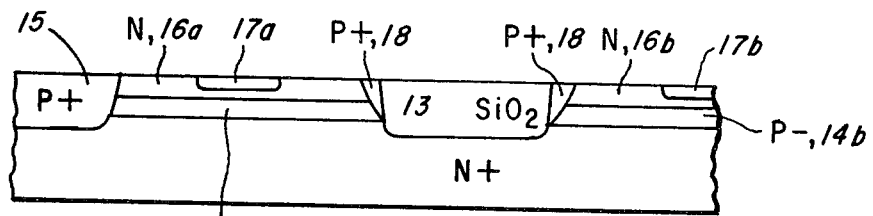

As shown in FIG. 7 the structure is then completed by the diffusion of P+ region 15 followed by the implantation of P− zones 14a and 14b, and then by the formation of contact enhancement zones 17a and 17b. It will be recognized that FIG. 7 includes all the regions represented in the structure of FIG. 1 except for the peripheral portions of oxide guard ring 13, which require no sidewall channel-stop regions. That is, peripheral oxide isolation zone 13 is fabricated with the etch step of FIG. 5, and the oxidation step of FIG. 6, but without the diffusion step of FIG. 4.

What is claimed is:

1. A method for the fabrication of an integrated semiconductor injection logic circuit having an inverted, multiple-collector transistor wherein the base region includes a plurality of lightly-doped active portions and a heavily-doped extrinsic portion, comprising the steps of:
    (a) forming a mask layer on a semiconductor slice, said mask layer being resistant to diffusion, etching and oxidation,
    (b) patterning said mask layer by removing a portion thereof to define mask apertures which expose an area of said slice to be located between two of said base and/or collector portions.
    (c) selectively diffusing a suitable dopant thru said mask apertures into said exposed area of the semiconductor slice, whereby regions are formed which have both vertically and laterally-doped portions,
    (d) then selectively etching said exposed area of the slice thru the same mask apertures to remove the full vertical extent of the vertically-doped portions, while leaving at least a part of the laterally-doped portions.
    (e) selectively oxidizing the etched areas of the slice to form isolation regions therein which are in some regions adjacent the retained part of said laterally-doped portions, and
    (f) completing the device to include active base portions isolated by said oxidized regions, whereby channel inversion is prevented along the isolated boundary of said active base portions.

2. A method as in claim 1 wherein said semiconductor is silicon and said isolation regions are silicon oxide.

3. A method as in claim 2 wherein the diffusion depth achieved in the step (c) is coordinated with the etching depth of step (d) in order to permit the oxidation of step (e) to achieve substantial coplanarity between the original semiconductor surface and the oxidized region.

4. A method for the fabrication of a semiconductor circuit including a dielectric isolation region surrounded by a channel-stop diffusion layer including the steps of:
    (a) patterning a mask layer on the surface of a semiconductor slice to define mask apertures which expose an area thereof where an isolation region is located,
    (b) selectively diffusing a suitable dopant thru said mask apertures into said exposed area of the semiconductor slice, whereby regions are formed which have both vertically and laterally-doped portions,
    (c) then selectively etching said exposed area through the same mask apertures to remove the full vertical extent of the vertically-doped portion, while leaving at least a part of the laterally-doped portion,
    (d) then selectively oxidizing the etched areas of the slice to form isolation regions therein adjacent the retained parts of said laterally-doped portions.

* * * * *